US006369658B1

(12) United States Patent
Nilson

(10) Patent No.: US 6,369,658 B1
(45) Date of Patent: Apr. 9, 2002

(54) SINGLE-ENDED TO DIFFERENTIAL TRANSCONDUCTOR

(75) Inventor: Christopher Donald Nilson, San Jose, CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/539,959

(22) Filed: Mar. 31, 2000

Related U.S. Application Data

(60) Provisional application No. 60/135,668, filed on May 24, 1999.

(51) Int. Cl.[7] .................................................. H03F 3/04
(52) U.S. Cl. ....................................... 330/301; 330/252
(58) Field of Search .......................... 330/307, 69, 252

(56) References Cited

U.S. PATENT DOCUMENTS

| | | | | | |
|---|---|---|---|---|---|
| 4,146,844 A | * | 3/1979 | Quinn | .......................... | 330/60 |
| 4,456,887 A | * | 6/1984 | Tokumo | ...................... | 330/252 |
| 4,490,685 A | * | 12/1984 | Sano | .......................... | 330/252 |
| 4,511,852 A | * | 4/1985 | Henrich et al. | ............. | 330/301 |
| 4,890,067 A | * | 12/1989 | Lamb | .......................... | 330/252 |
| 5,220,286 A | | 6/1993 | Nadeem | ......................... | 330/9 |
| 5,703,477 A | | 12/1997 | Punzenberger | .............. | 323/313 |
| 5,714,906 A | | 2/1998 | Motamed et al. | ........... | 327/563 |
| 5,729,176 A | * | 3/1998 | Main et al. | .................. | 330/252 |
| 5,831,784 A | * | 11/1998 | Barnett et al. | .............. | 330/252 |
| 6,097,941 A | * | 8/2000 | Helferich | ..................... | 455/550 |

* cited by examiner

*Primary Examiner*—Robert Pascal
*Assistant Examiner*—Khanh V. Nguyen
(74) *Attorney, Agent, or Firm*—Merchant & Gould PC

(57) ABSTRACT

A conversion circuit in a transceiver system is capable of converting a single-ended input voltage signal to balanced differential output signals. An input voltage signal can be referenced to the ground (zero voltage) GND and can travel both above and below the zero voltage. A plurality of feedback circuits, having a plurality of transistors and a plurality of resistances, disposed and coupled in a mirror image, to boost an input impedance to an output impedance of a gain of one of the transistors, to isolate an output load from an input of the conversion circuit, and to provide a voltage gain from the input to an output determined by the plurality of resistances.

8 Claims, 3 Drawing Sheets

US 6,369,658 B1

SINGLE-ENDED TO DIFFERENTIAL TRANSCONDUCTOR

RELATED APPLICATIONS

This application claims the benefit of Provisional Application, U.S. Ser. No. 60/135,668 filed on May 24, 1999, entitled to "SINGLE-ENDED TO DIFFERENTIAL TRANSCONDUCTOR", by Christopher D. Nilson.

FIELD OF THE INVENTION

The invention relates generally to a transceiver system, more particularly, to a single-ended to differential transconductor circuit in a transceiver system.

BACKGROUND OF THE INVENTION

In a radio transceiver system, a single-ended signal is received from an antenna. To obtain balanced signals, a single-ended signal is converted to balanced differential signals. Typically, a balanced/unbalanced (Balun) circuit is used to convert an unbalanced single-ended signal to balanced differential signals.

A single-ended signal, generally an AC signal, is input in a balanced/unbalanced (Balun) circuit. An input signal travels about above and below the ground (0 V). Typically, it is desired to reference an input signal to ground (0 V) in a Balun circuit as it eliminates the needs of additional DC power supplies. However, a ground level voltage is not stable and often varies, which causes AC signals to vary in a very unpredictable way. To solve this problem, additional DC power supplies, such as a single DC power supply or dual DC power supplies, are often used to shift the ground reference voltage level to a stable DC voltage level. As a result, extra DC power supplies have to be used, thereby making a transceiver system large in size and much more expensive.

Another problem in the past is that a typical Balun circuit, such as an Op-Amp, has a low output impedance. The low output impedance generally interferes with a circuit to which the Balun circuit is connected.

It is with respect to these and other considerations that the present invention has been made.

SUMMARY OF THE INVENTION

In accordance with this invention, the above and other problems were solved by providing a single-ended to differential transconductor or conversion circuit to generate balanced differential output current signals and/or balanced differential output voltage signals from a single-ended input voltage signal.

In one embodiment of the present invention, the conversion circuit is capable of converting a single-ended input voltage signal to balanced differential signals, wherein an input voltage signal is referenced to ground (zero voltage) and travels both above and below the ground. The conversion circuit includes a pair of feedback circuits, having a plurality of transistors and a plurality of resistances, disposed and coupled in a mirror image, to boost an input impedance to an output impedance of a gain of one of the transistors, to isolate an output load from an input of the conversion circuit, and to provide a voltage gain from the input to an output of the conversion circuit determined by the plurality of resistances.

In one embodiment, a circuit for converting a single-ended input signal to differential output signals in accordance with the principles of the present invention includes a first feedback circuit having first and second transistors disposed in series; an input port, coupled to the first transistor, to receive the single-ended input signal; a first shunt voltage node, disposed between the first and second transistors, to receive a shunt feedback which buffers the single-ended input signal to the first shunt voltage node; and an output port to output one of the differential output signals. The circuit also includes a second feedback circuit having third and fourth transistors disposed in series; an input port, coupled to the third transistor, to connect to the ground; a second shunt voltage node, disposed between the third and fourth transistors, to receive a shunt feedback which buffers a ground voltage to the second shunt voltage node; and an output port to output the other differential output signal.

Still in one embodiment, the circuit in accordance with the principles of the present invention further includes a first resistance disposed between the first shunt voltage node and the second shunt voltage node; a first current source coupled to the first and second transistors; a second current source coupled to the first shunt voltage node; a third current source coupled to the third and fourth transistors; a fourth current source coupled to the second shunt voltage node; a second resistance coupled to the first output port and the second transistor; and a third resistance coupled to the second output port and the fourth transistor.

In one embodiment, a transceiver system in accordance with the principles of the present invention includes an antenna for receiving a single-ended input signal; a bandpass filter to filter out noise received from the antenna; a transceiver to recover the received input signal from before the signal is transmitted; and an antenna interface coupled between the bandpass filter and the transceiver. The antenna interface includes a conversion circuit to convert the single-ended input signal to differential output signals. The circuit includes a first feedback circuit having first and second transistors disposed in series; an input port, coupled to the first transistor, to receive the single-ended input signal; a first shunt voltage node, disposed between the first and second transistors, to receive a shunt feedback which buffers the single-ended input signal to the first shunt voltage node; and an output port to output one of the differential output signals. The circuit also includes a second feedback circuit having third and fourth transistors disposed in series; an input port, coupled to the third transistor, to connect to the ground; a second shunt voltage node, disposed between the third and fourth transistors, to receive a shunt feedback which buffers a ground voltage to the second shunt voltage node; and an output port to output the other differential output signal.

Still in one embodiment, the conversion circuit further includes a first resistance disposed between the first shunt voltage node and the second shunt voltage node; a first current source coupled to the first and second transistors; a second current source coupled to the first shunt voltage node; a third current source coupled to the third and fourth transistors; a fourth current source coupled to the second shunt voltage node; a second resistance coupled to the first output port and the second transistor; and a third resistance coupled to the second output port and the fourth transistor.

Further in one embodiment, a gain of the conversion circuit is determined by the first, second, and third resistances.

Yet in one embodiment, an output impedance of the conversion circuit is determined by the gain of the first transistor.

Accordingly, additional DC power supplies for a DC voltage level shift can be eliminated in the present invention.

Further, external pins can be reduced. Furthermore, a high output impedance is provided in the present invention such that the interference to a connected circuit can be significantly reduced. The conversion circuit of the present invention having a high output impedance can be readily adopted by a test equipment.

These and various other features as well as advantages which characterize the present invention will be apparent from a reading of the following detailed description and a review of the associated drawings.

BRIEF DESCRIPTION OF THE DRAWINGS

Referring now to the drawings in which like reference numbers represent corresponding parts throughout.

DETAILED DESCRIPTION

In the following description of the present invention, reference is made to the accompanying drawings which form a part hereof, and in which is shown by way of illustration specific embodiments in which the invention may be practiced. It is understood that other embodiments may be utilized and structural changes may be made without departing from the scope of the present invention.

The present invention allows for a transceiver system to have balanced differential output current signals converted from a single-ended input voltage signal. The input voltage signal is referenced to the ground (zero voltage) GND and can travel both above and below the zero voltage. A plurality of feedback circuits are used to boost an input impedance to a high output impedance, to isolate an output load from an input stage, and to provide a low-impedance buffered copy of an input signal at an intermediate shunt voltage node. In one embodiment, the output current can be converted to an output voltage VOUT.

Figure 1:
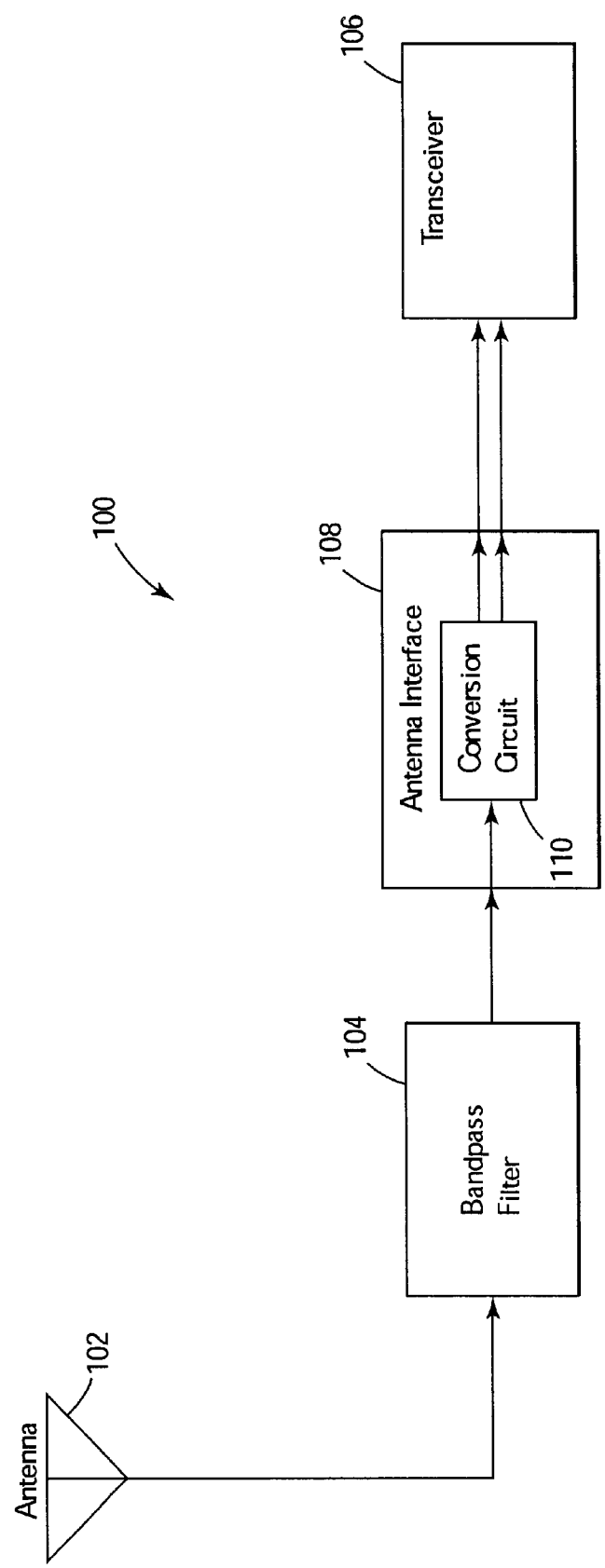
FIG. 1 illustrates a block diagram of one embodiment of a transceiver system in accordance with the principles of the present invention.

As shown in FIG. 1, a transceiver system 100, generally in accordance with the principles of the present invention, includes an antenna 102 to receive a single-ended input signal, a bandpass filter 104 to filter out noise received from the antenna 102, a transceiver 106 to recover the received input signal from before the signal is transmitted, and an antenna interface 108. The antenna interface 108 is coupled between the bandpass filter 104 and the transceiver 106. The antenna interface 108 includes a conversion circuit 110 to convert the single-ended input signal to balanced differential output signals. FIG. 1 illustrates a receive path of the transceiver system 100. It is appreciated that a transmit path of the transceiver system 100 can be implemented, without departing from the scope of the present invention, so that signals can be transmitted from a transmitter portion of the transceiver 106 to the antenna 102 via the antenna interface 108 and the bandpass filter 104.

Figure 2:
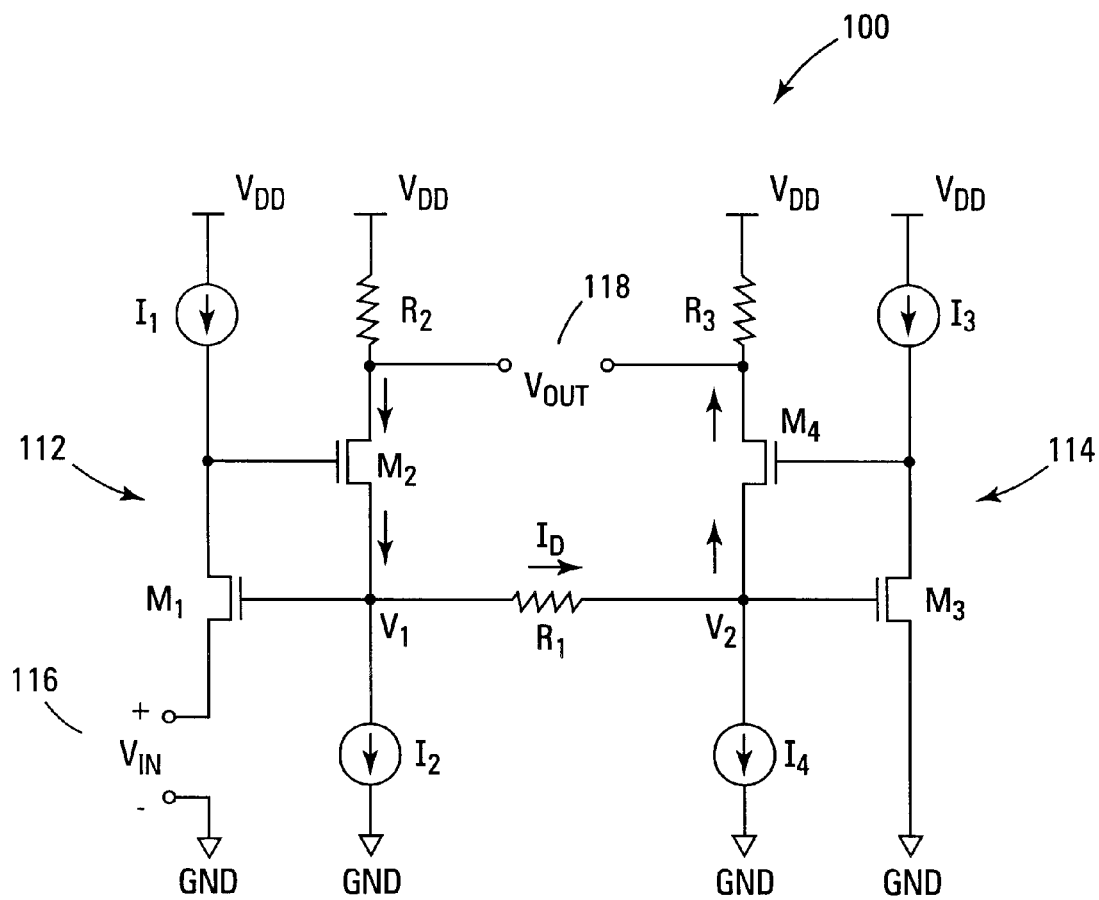
FIG. 2 illustrates a circuit diagram of one embodiment of a single-ended to differential conversion circuit in accordance with the principles of the present invention.
Figure 3:
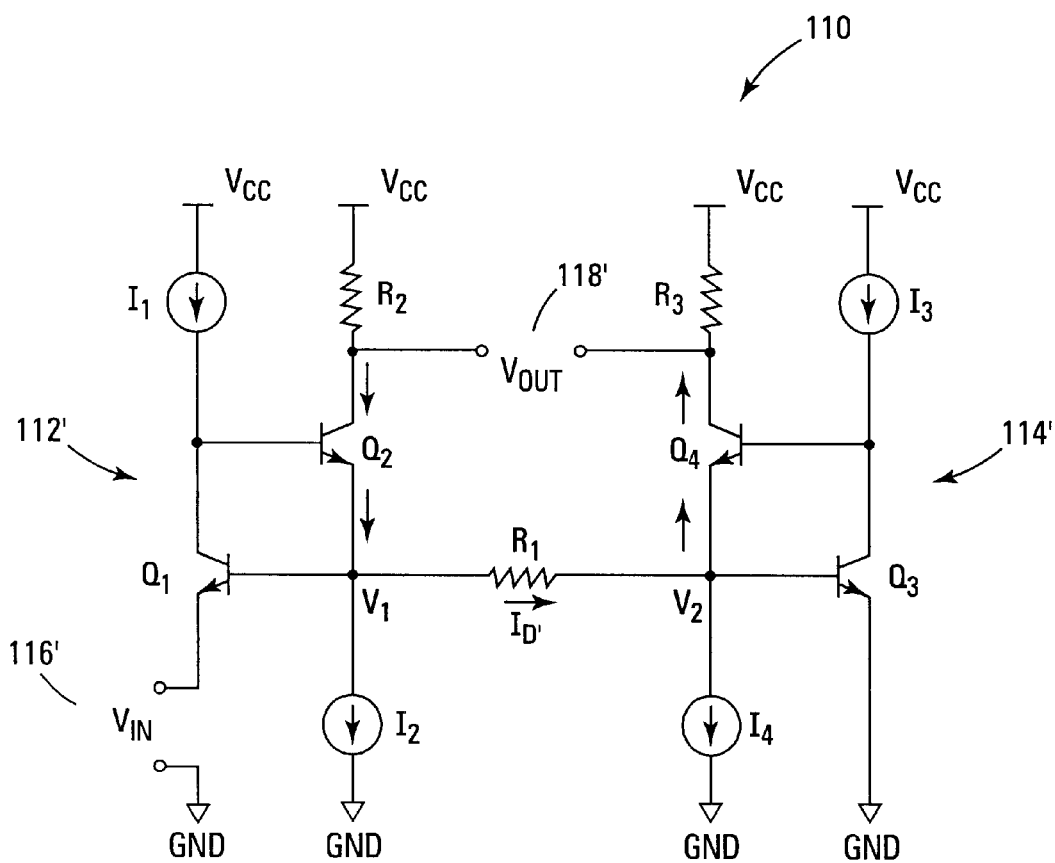
FIG. 3 illustrates a circuit diagram of another embodiment of a single-ended to differential conversion circuit in accordance with the principles of the present invention.

The conversion circuit 110 is shown in details in FIGS. 2 and 3 by way of example. In FIG. 2, the conversion circuit 110 includes a first feedback circuit 112 having a first transistor M1 and a second transistor M2 disposed in series and a second feedback circuit 114 having a third transistor M3 and a fourth transistor M4 disposed in series. The first and second feedback circuits 112, 114 are disposed and coupled in a mirror image. The transistors M1, M2, M3 and M4 can be implemented in MOSFET transistors (FIG. 2) or Bipolar transistors Q1, Q2, Q3, Q4 (FIG. 3). It is appreciated to a person skilled in the art that any other suitable transistors can be implemented within the scope or spirit of the present invention.

In FIG. 2, the first feedback circuit 112 includes an input port 116, coupled to the source of the first transistor M1, to receive the single-ended input signal VIN. A first shunt voltage node V1 is disposed between the gate of the first transistor M1 and the source of the second transistor M2, to receive a shunt feedback which buffers the single-ended input signal VIN to the first shunt voltage node V1. At the input port 116, the second transistor M2 provides series feedback which raises an output impedance by approximately the gain of the first transistor M1. Hence, the first feedback circuit 112 does not load the input signal VIN significantly. At the shunt voltage node V1, the shunt feedback lowers an impedance by a similar amount. Thus, the voltage at the node V1 is a buffered version of the voltage VIN from the input port 116. The buffered version is shifted above ground by the gate-source voltage of the first transistor M1.

A similar feedback action is provided by the second feedback circuit 114. The third transistor M3 has a source connected to the ground GND. A second shunt voltage node V2 is disposed between the gate of the third transistor M3 and the source of the fourth transistor M4, to receive a shunt feedback which buffers the ground GND to the second shunt voltage node V2. A similar action by the third and fourth transistors M3 and M4 generates a low impedance version of the ground GND buffered over on the second shunt voltage node V2 such that the voltage at the node V2 is the ground voltage (zero volts). Thus, the input voltage VIN crosses over a first resistance R1.

At the output port 118, the feedback provided by M1 is series which raises the impedance at VOUT by approximately the gain of M1.

A first current source I1 is connected to the drain of the first transistor M1 and the gate of the second transistor M2. A second current source I2 is connected to the first shunt voltage node V1. A third current source I3 is connected to the drain of the third transistor M3 and the gate of the fourth transistor M4. A fourth current source I4 is connected to the second shunt voltage node V2. Since the second current source I2 and the fourth current source I4 are fixed, a current $I_D$ flowing through the first resistance R1 must also flow differentially through the second transistor M2 and the fourth transistor M4. In this example, the differential current $I_D$, buffered by the second transistor M2 and the fourth transistor M4, is converted to an output voltage VOUT by a second resistance R2 and a third resistance R3. This results in a nominal voltage gain from VIN to VOUT, which is equal to $2*R2/R1$ (in an example where R2=R3).

Also, the first and second feedback circuits 112, 114 make the output current $I_D$ relatively independent of the characteristics of the transistors M1, M2, M3, and M4, and instead make the output current $I_D$ be determined by the resistances, R1, R2, and R3. As a result, the transfer characteristic from the input stage to the output stage is more linear thereby producing less distortion to the signals. Thus, VIN can swing above or below GND. In an integrated circuit (IC) implementation, the magnitude of the VIN may be limited to less than a diode drop (e.g. 0.6V) due to the PN junction formed by the substrate (P-type) and the source junction (N-type) of the first transistor M1.

Further in FIG. 2, the input signal VIN has to absorb the current of the current source I1 without changing significantly. Thus, a relatively low impedance is provided at the input port 116, whereas a relatively high impedance is provided at the output port 118.

As shown in FIG. 2, the conversion circuit 110 in accordance with the present invention converts a single-ended input signal VIN that swings about the ground GND to balanced differential signals. Further, the conversion circuit 110 features a low input impedance and a high output impedance and is relatively independent from transistors' characteristics or parameters due to the feedback provided by the feedback circuits 112, 114. In an example, the output impedance of the conversion circuit 110 is determined by the gain of the first transistor M1.

In FIG. 3, a conversion circuit 110' is implemented by using the Bipolar transistors Q1,Q2,Q3, and Q4 the first feedback circuit 112' includes an input port 116', coupled to the emitter of the first transistor Q1, to receive the single-ended input signal VIN. A first shunt voltage node V1 is disposed between the base of the first transistor Q1 and the emitter of the second transistor Q2, to receive a shunt feedback which buffers the single-ended input signal VIN to the first shunt voltage node V1. At the input port 116', the second transistor Q2 provides series feedback which raises an output impedance by approximately the gain of the first transistor Q1. Hence, the first feedback circuit 112' does not load the input signal VIN significantly. At the shunt voltage node V1, the shunt feedback lowers an impedance by a similar amount. Thus, the voltage at the node V1 is a buffered version of the voltage VIN from the input port 116'. The buffered version is shifted above ground by the gate-source voltage of the first transistor Q1.

A similar feedback action is provided by the second feedback circuit 114'. The third transistor Q3 has a source connected to the ground GND. A second shunt voltage node V2 is disposed between the gate of the third transistor Q3 and the source of the fourth transistor Q4, to receive a shunt feedback which buffers the ground GND to the second shunt voltage node V2. A similar action by the third and fourth transistors Q3 and Q4 generates a low impedance version of the ground GND buffered over on the second shunt voltage node V2 such that the voltage at the node V2 is the ground voltage (zero volts). Thus, the input voltage VIN crosses over a first resistance R1.

At the output port 118', the feedback provided by Q1 is series which raises the impedance at VOUT by approximately the gain of Q1.

A first current source I1 is connected to the collector of the first transistor Q1 and the base of the second transistor Q2. A second current source I2 is connected to the first shunt voltage node V1. A third current source I3 is connected to the collector of the third transistor Q3 and the base of the fourth transistor Q4. A fourth current source I4 is connected to the second shunt voltage node V2. Since the second current source I2 and the fourth current source I4 are fixed, a current $I_D'$ flowing through the first resistance R1 must also flow differentially through the second transistor Q2 and the fourth transistor Q4. In this example, the differential current $I_D'$, buffered by the second transistor Q2 and the fourth transistor Q4, is converted to an output voltage VOUT by a second resistance R2 and a third resistance R3. This results in a nominal voltage gain from VIN to VOUT, which is equal to 2*R2/R1 (in an example where R2=R3).

Also, the first and second feedback circuits 112', 114' make the output current $I_D'$ relatively independent of the characteristics of the transistors Q1, Q2, Q3, and Q4, and instead make the output current $I_D'$ be determined by the resistances, R1, R2, and R3. As a result, the transfer characteristic from the input stage to the output stage is more linear thereby producing less distortion to the signals. Thus, VIN can swing above or below GND. In an integrated circuit (IC) implementation, the magnitude of the VIN may be limited to less than a diode drop (e.g. 0.6V) due to the PN junction formed by the substrate (P-type) and the source junction (N-type) of the first transistor Q1.

Further in FIG. 3, the input signal VIN has to absorb the current of the current source I1 without changing significantly. Thus, a relatively low impedance is provided at the input port 116', whereas a relatively high impedance is provided at the output port 118'.

As shown in FIG. 3, the conversion circuit 110' in accordance with the present invention converts a single-ended input signal VIN that swings about the ground GND to balanced differential signals. Further, the conversion circuit 110' features a low input impedance and a high output impedance and is relatively independent from transistors' characteristics or parameters due to the feedback provided by the feedback circuits 112', 114'. In this example, the output impedance of the conversion circuit 110' is determined by the gain of the first transistor Q1.

Accordingly, additional DC power supplies for a DC voltage level shift can be eliminated in the present invention. Further, external pins can be reduced in the present invention. Furthermore, the high output impedance of the conversion circuit significantly reduces the interference to a connected circuit, such that the conversion circuit is readily adopted by a test equipment.

It is appreciated that various devices and/or components of the transceiver system 100, such as an impedance matching circuit in the antenna interface 108, a Low Noise Amplifier (LNA) in the transceiver 106, etc., are not shown in the figures as they are not the focus of the present invention. On the other hand, these devices and/or components are known to a person skilled in the art and can be implemented within the scope of the present invention. Also, it is appreciated that coupling lines or wires shown in FIG. 1 can be replaced by infrared or other suitable wireless coupling devices to achieve the principles of the present invention.

It is to be understood that even though numerous characteristics and advantages of various embodiments of the present invention have been set forth in the foregoing description, together with details of the structure and function of various embodiments of the invention. This disclosure is illustrative only, and changes may be made in detail within the principles of the present invention to the full extent indicated by the broad general meaning of the terms in which the appended claims are expressed.

What is claimed is:

1. A conversion circuit for a transceiver system capable of converting a single-ended input voltage signal to balanced differential signals comprising:

a pair of feedback circuits, having a plurality of transistors and a plurality of resistances, each feedback circuit including at least two transistors with a shunt voltage node disposed therebetween, a first current source coupled to the at least two transistors, and a second current source coupled to the shunt voltage node, the pair of feedback circuits being disposed and coupled in a mirror image, to boost an input impedance to an output impedance of a gain of one of the transistors, to isolate an output load from an input of the conversion circuit, and to provide a voltage gain from the input to an output determined by the plurality of resistances, and a first one of said pair of feedback circuits including an input port to receive a single-ended input signal that is referenced to ground (zero voltage).

2. A conversion circuit for transceiver system for converting a single-ended input signal to differential output signals, comprising:
- a first feedback circuit including:
  - first and second transistors disposed in series;
  - an input port, coupled to the first transistor, to receive the single-ended input signal that is referenced to ground (zero voltage);
  - a first shunt voltage node, disposed between the first and second transistors, to receive a shunt feedback which buffers the single-ended input signal to the first shunt voltage node; and
  - an output port to output one of the differential output signals;
- a second feedback circuit including:
  - third and fourth transistors disposed in series;
  - an input port, coupled to the third transistor, to connect to the ground;
  - a second shunt voltage node, disposed between the third and fourth transistors, to receive a shunt feedback which buffers a ground voltage to the second shunt voltage node; and
  - an output port to output the other differential output signal;
- a first resistance disposed between the first shunt voltage node and the second shunt voltage node;
- a first current source coupled to the first and second transistors;
- a second current source coupled to the first shunt voltage node;
- a third current source coupled to the third and fourth transistors;
- a fourth current source coupled to the second shunt voltage node;
- a second resistance coupled to the first output port and the second transistor; and
- a third resistance coupled to the second output port and the fourth transistor.

3. The transceiver system of claim 2, wherein a gain of the conversion circuit is determined by the first, second, and third resistances.

4. The transceiver system of claim 2, wherein an output impedance of the conversion circuit is determined by the gain of the first transistor.

5. A transceiver system, comprising:
- an antenna for receiving a single-ended input signal;
- a bandpass filter to filter out the noise received from the antenna;
- a transceiver to recover the received input signal from before the signal is transmitted; and
- an antenna interface coupled between the bandpass filter and the transceiver;
- wherein the antenna interface includes a conversion circuit to convert the single-ended input signal to differential output signals;
- wherein the conversion circuit comprises:
  - a first feedback circuit including:
    - first and second transistors disposed in series;
    - an input port, coupled to the first transistor, to receive the single-ended input signal that is referenced to ground (zero voltage);
    - a first shunt voltage node, disposed between the first and second transistors, to receive a shunt feedback which buffers the single-ended input signal to the first shunt voltage node; and
    - an output port to output one of the differential output signals;
  - a second feedback circuit including:
    - third and fourth transistors disposed in series;
    - an input port, coupled to the third transistor, to connect to the ground;
    - a second shunt voltage node, disposed between the third and fourth transistors, to receive a shunt feedback which buffers a ground voltage to the second shunt voltage node; and
    - an output port to output the other differential output signal; and
  - a first resistance disposed between the first shunt voltage node and the second shunt voltage node.

6. The transceiver system of claim 5, further comprising:
- a first current source coupled to the first and second transistors;
- a second current source coupled to the first shunt voltage node;
- a third current source coupled to the third and fourth transistors;
- a fourth current source coupled to the second shunt voltage node;
- a second resistance coupled to the first output port and the second transistor; and
- a third resistance coupled to the second output port and the fourth transistor.

7. The transceiver system of claim 6, wherein a gain of the conversion circuit is determined by the first, second, and third resistances.

8. The transceiver system of claim 6, wherein an output impedance of the conversion circuit is determined by the gain of the first transistor.

* * * * *